United States Patent [19]
Chia et al.

[11] Patent Number: 6,110,815
[45] Date of Patent: Aug. 29, 2000

[54] ELECTROPLATING FIXTURE FOR HIGH DENSITY SUBSTRATES

[75] Inventors: Chok J. Chia, Cupertino; Patrick Variot, San Jose; Maniam Alagaratnam, Cupertino, all of Calif.

[73] Assignee: LSI Logic Corporation, Milpitas, Calif.

[21] Appl. No.: 09/103,291

[22] Filed: Jun. 23, 1998

[51] Int. Cl.[7] .................................................. H01L 21/44
[52] U.S. Cl. ........................ 438/612; 438/611; 438/613; 438/614; 438/615; 438/616; 438/617; 228/180.21; 228/180.22; 228/180.5
[58] Field of Search .................................... 438/611–617; 228/180.21, 180.22, 180.5

[56] References Cited

U.S. PATENT DOCUMENTS 5,180,691   1/1993   Adachi et al. .......................... 437/235

*Primary Examiner*—John F. Niebling
*Assistant Examiner*—David A. Zarneke
*Attorney, Agent, or Firm*—Thomas F. Lebens; Fitch Even Tabin and Flannery

[57] ABSTRACT

A method of electroplating a high density integrated circuit (IC) substrate using a conductive elastomer including the steps of providing an IC substrate made of nonconductive material having a plurality of conductive traces with conductive trace lands formed on its surface. Covering only the traces (not the trace lands) with a plating resist and exposing portions of the conductive traces. Inserting the IC substrate into a electroplating fixture. Engaging a conductive elastomer to the IC substrate, covering the plurality of conductive traces and electrically connecting all of the traces together. Electroplating the trace lands on the IC substrate with conductive material (such as gold or nickel) by using the conductive elastomer as the electrical connection to the trace lands (via the exposed metal traces). Disengaging the conductive elastomer after electroplating is finished and removing the IC substrate from the electroplating fixture.

15 Claims, 1 Drawing Sheet

ELECTROPLATING FIXTURE FOR HIGH DENSITY SUBSTRATES

BACKGROUND OF THE INVENTION

The present invention relates to plating integrated circuit packages, and more particularly to electroplating trace end land portions of the traces on an integrated circuit (IC) substrate using an electroplating fixture having a conductive elastomer in contact with the traces during plating.

In the last few decades, the electronics industry has literally transformed the world. Electronic devices are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) chip, and the more efficient packaging of the IC chip, have played a key role in the success of these devices.

Integrated circuit substrates are used to connect the IC chip to the electronic package. One popular group of packages is the Grid Array package, which consists of an IC substrate for mounting and interconnecting the IC chip to the electronic package. On the top surface of the IC substrate, an IC chip is mounted and electrically connected to the end or lands of traces that are formed on the top surface of the IC substrate. On the bottom surface of the IC substrate, pins or solder balls are mounted in an array pattern for connection of the electronic package.

The IC chip is typically attached in the center of the IC substrate. Wires are used to connect a plurality of contact pads on the IC chip to lands on the IC substrate. The lands are typically the ends of the traces near the IC chip. Alternatively, the IC chip can be connected directly to the lands by solder bumps (this is known as a flip-chip connection). The lands are in turn connected to the array of pins or balls on the opposite surface on the IC substrate by metal traces and vias through the IC substrate. The metal traces are typically made of copper.

For wire bonding or bump attachment of the IC chip, the lands should be plated with gold, nickel or silver. The preferred method of plating is electroplating. Electroplating is easily controlled, efficient and cost effective. During the electroplating process, conductive material is deposited in preselected areas. Electroplating requires that an electrically conductive connection be made to all the trace lands that are to be plated. To prevent the conductive material from piling on undesired areas, the traces and IC substrate are covered so that the plating will not stick. This can be done with a plating resist material that is applied to the IC substrate. In certain areas where the plating material is desired, the resist material is not applied or is removed (such as the trace lands). The plating solution bath and the exposed area on the conductive traces or lands function as a pair of electrodes. An electric current flows from an outside source through traces to deposit desired conductive material on the selected areas of the IC substrate.

To electrically connect the lands and traces together, the traces are typically extended to the outside edge of the IC substrate where they are connected to a plating bus, which is used only for plating. After the electroplating, the plating bus is removed before the electronic package is finished. For low density packages, it is relatively easy to incorporate the bus in the design of the IC substrate. For very dense designs, the metal traces on the IC substrate are spaced very close together. In some cases, it is not possible to route all the metal traces to the edge of the package for connection to the bus.

In the case where an independent conductive trace cannot be extended to the periphery of the circuit board to connect to the bus, the trace is temporally connected to another close trace by an additional conductive pattern so that an electrical current flows from a peripheral conductive pattern through the desired conductive segment. Such an additional conductive pattern, which is unnecessary in the final IC substrate configuration, is called a "plating lead pattern". The plating lead patterns are only necessary as an intermediate step in the plating step of the IC substrate. Once the plating is done, the traces must again be electrically isolated. Thus, the electrical interconnection between the independent conductive traces must be removed before the IC substrate is finished. The plating bus and plating lead patterns add complexity and cost to the manufacture of the IC substrate.

In view of the above, it is evident that what is needed is a low-cost method of electroplating trace lands of a high density IC substrate without the need for a permanent plating bus or the addition of plating lead patterns.

SUMMARY OF THE INVENTION

The present invention addresses the above and other needs by providing a electroplating fixture that provides a temporary plating bus for use in electroplating trace lands of a high density integrated circuit substrate, eliminating the need for a permanent plating bus or plating lead patterns.

In one embodiment of the present invention, the integrated circuit substrate has a plurality of traces formed on the surface. The traces terminate forming trace lands or integrated circuit (IC) contacts near an IC chip attach area near the center of the substrate. For electrical attachment of an IC chip to the traces (i.e., wire bond, solder bumps), attachment trace lands or IC contacts must be plated with nickel, gold or silver. To prevent unwanted areas of the traces from being plated during the electroplating process, the traces on the IC substrate are covered with a plating resist. The trace lands are not covered with resist.

Selected portions of the resist are removed, exposing the traces for attaching to a temporary plating bus. For electroplating of the trace lands, the substrate is placed into an electroplating fixture. The electroplating fixture includes the temporary plating bus, which is made of rings or beads of conductive elastomer material attached to a metal frame of the electroplating fixture. Once the substrate is in the electroplating fixture, the conductive elastomer of the temporary plating bus is aligned with and makes contact with the exposed metal traces where the resist has been removed from the substrate. The conductive elastomer temporarily connects all of the traces together electrically. When the conductive elastomer is removed from the traces, the traces will once again be electrically independent. Electroplating the trace lands with nickel, silver, or preferably gold, is then done in the conventional electrolytic process using the conductive elastomer as an electrical connection to the exposed traces for plating the trace lands. In the plating process, the current for plating flows from the frame, through the conductive elastomer and into the metal traces and to the trace lands. Thus, the substrate does not require plating busses for electroplating the trace lands or IC contacts.

After the plating process is completed, the conductive elastomer is lifted off the IC substrate, uncoupling the electrical connection between all of the traces. The gold-plated trace lands can now be used for connection between the IC substrate and an integrated circuit chip. The lower surface of the IC substrate is then attached to an electronic package or printed circuit board in a conventional manner.

Advantageously, use of the present invention allows the use of electroplating of the trace lands for the wire bond and solder bump pads for very dense designs that does not permit routing of plating busses in the metal layers of the substrate. The present invention eliminates the need for the plating bus on a dense IC substrate. Electroplating is less costly and higher quality than other methods and results in a more reliable and cost effective package.

BRIEF DESCRIPTION OF THE DRAWINGS

The above and other aspects, features and advantages of the present invention will be more apparent from the following more particular description thereof, presented in conjunction with the following drawings wherein.

Below is a list of reference numbers associated with the figures.

| No. | Component |
| --- | --- |
| 10 | Integrated Circuit Substrate Package |
| 15 | Exposed Traces |
| 20 | Trace Land or End Portion of Trace |
| 25 | Solder Resist |
| 26 | Opening in Resist Exposing the Traces |
| 30 | IC Chip Attach Area |
| 35 | Substrate |
| 40 | Conductive Elastomer |
| 41 | Pressure Arrows |
| 45 | Gold-plated Land or Trace |
| 50 | Electroplating Fixture |
| 51 | Metal Frame |
| 55 | Resist Covering Exposed Traces |
| 60 | Solder Ball |
| 65 | Printed Circuit Board |
| 70 | Contact Area Between the Trace and the Conductive Elastomer |
| 100 | Integrated Circuit Chip or Flip-Chip |
| 105 | Wire Bond |

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
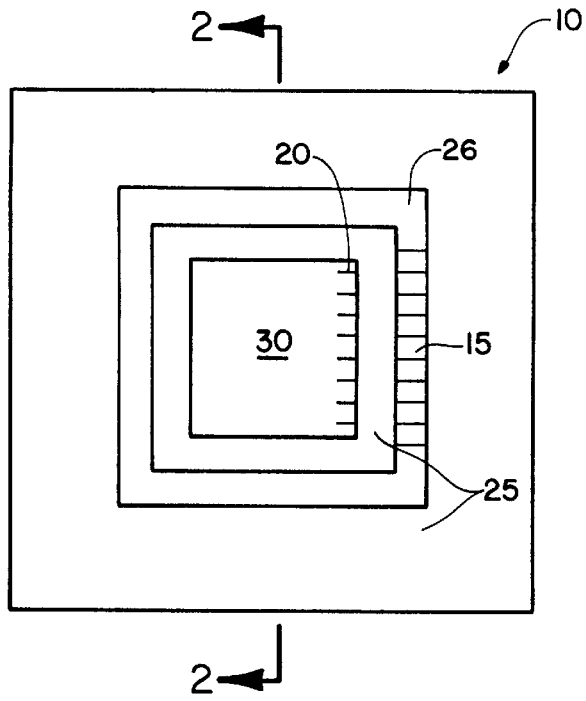
FIG. 1 is a plan view of the integrated circuit substrate with areas of resist removed exposing the traces and trace lands.
Figure 2:
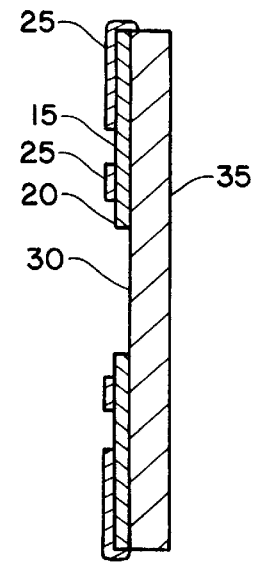
FIG. 2 is a cross-sectional view of FIG. 1 showing the integrated circuit substrate with traces formed on the top surface with areas of resist removed exposing the traces.

FIG. 1 shows plan view of an integrated circuit (IC) substrate package 10 made in the conventional method that is known in the art. FIG. 2 is a cross-sectional view of the IC substrate 10 of FIG. 1. The IC substrate package 10 begins with a substrate 35 that is made from a nonconductive material such as a ceramic or plastic material, for example: Kapton, polyimide or PVC. Located on the top surface of the substrate 35 is a plurality of conductive traces 15. While the figures show the traces 15 on the top surface, it is understood that the traces may also be on the bottom surface. The traces 15 are made from conductive material such as copper, or copper plated with gold or silver. Near the center of the substrate 35 there is an IC chip attach area 30. Covering the substrate 35 and the traces 15 is a layer of solder resist material 25. Areas of the solder resist material 25 are removed forming a resist opening 26, exposing the traces 15. The chip attach area 30 and the trace lands 20 are not covered in resist.

Figure 3:
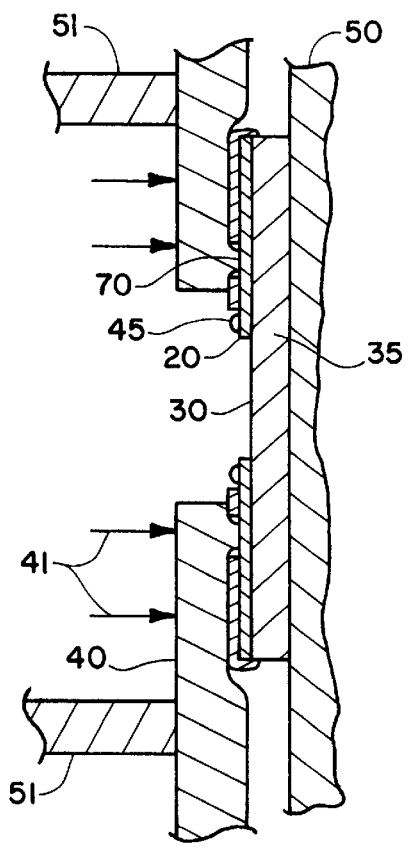
FIG. 3 is a view similar to FIG. 2 showing a conductive elastomer of an electroplating fixture in contact with the exposed traces, electrically connecting the traces together.

Referring now to FIG. 3, the substrate package 10 is placed in an electroplating fixture 50. The electroplating fixture 50 holds the substrate package 10 during the electroplating process. The electroplating fixture has a metal frame 51 made from a conductive material, such as stainless steel, that is attached to the current source during the electroplating process. Attached to the metal frame 51 is a conductive elastomer 40 that may be shaped as rings or beads and is made of a conductive material such as carbon filled silicone rubber. During use, the conductive elastomer 40 aligns with the resist opening 26 (where the resist is removed) and makes contact 70 with the exposed traces 15. The conductive elastomer 50 temporarily connects all of the traces 15 together electrically for the electroplating process. Pressure is used to keep the conductive elastomer 40 in contact with the exposed traces 15 (shown as arrows 41). The pressure force can be generated with a variety of devices such as a press, clamp or vise.

Electroplating of the trace lands 20 with nickel, silver or preferably gold, is done in the conventional electrolytic process using the conductive elastomer 40 of the electroplating fixture 50 as the electrical connection for plating the trace lands 20 (via the exposed traces 15 on the IC substrate package 10). During the electroplating process, the current for electroplating the trace lands 20 flows from the metal frame 51, through the conductive elastomer 40 and into the metal traces 15 and finally to the trace lands 20. Thus, the substrate does not require a permanent plating buss for electroplating of the lands or contacts.

Figure 4:
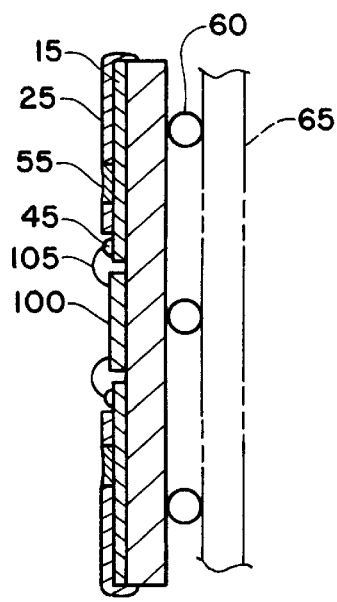
FIG. 4 is a cross-sectional view of the substrate with the conductive elastomer removed showing the electroplated trace lands and attachment with an IC chip and printed circuit board.

After the electroplating process is completed, conductive elastomer 40 is removed from the IC substrate package 10, as shown in FIG. 4. The portions of the traces 15 that were originally covered by the conductive elastomer 40 may now be coated with resist 55 as needed. The gold-plated trace lands 45 of the traces 15 can now be used for connection between the IC substrate 10 and an integrated circuit chip 100. One such electrical connection is a wire bond 105, electrically connecting the IC chip 100 to the gold-plated lands 45. Alternately, the IC chip 100 may be a flip-chip that attaches to the gold-plated lands 45 with a plurality of solder bumps (not shown). On the lower surface of the IC substrate package 10 is a plurality of solder balls 60 for electrical attachment to an electronic package or printed circuit board 65.

Advantageously, use of the present invention allows the use of electroplating of the trace lands for the wire bond and solder bump pads for very dense designs that does not permit routing of plating busses in the metal layers of the substrate. The present invention eliminates the need for the plating bus on a dense IC substrate. The number and arrangement of the traces 15 in the figures is meant to teach the present invention, but is not necessarily meant to show the actual number and arrangement of the traces that may be used in an IC package.

While the invention herein disclosed has been described by means of specific embodiments and applications thereof, numerous modifications and variations could be made thereto by those skilled in the art without departing from the scope of the invention set forth in the claims.

What is claimed is:

1. A method of electroplating the end of conductive traces forming conductive trace lands on an integrated circuit (IC) substrate for attaching to an IC chip, said method comprising:
   (a) providing an IC substrate having a first surface and a second surface;
   (b) forming a plurality of conductive traces on a first surface of the IC substrate, the ends of the conductive traces forming conductive trace lands;
   (c) coating the IC substrate with plating resist covering only the traces;
   (d) selectively removing portions of the plating resist exposing portions of the conductive traces whose conductive trace lands require electroplating;
   (e) attaching a conductive elastomer to the exposed portions of the conductive traces and electrically connecting the conductive traces together;
   (f) electroplating with conductive material the conductive trace lands on the IC substrate using the conductive elastomer as the electrical connection for the conductive trace lands to be plated; and
   (g) removing the conductive elastomer from the exposed traces after electroplating.

2. The method of claim 1 wherein the conductive elastomer is connected to an electroplating fixture.

3. The method of claim 1 wherein the attachment of the conductive elastomer with the exposed portions of the traces is by pressure.

4. The method of claim 1 wherein the conductive elastomer is made from carbon filled silicone rubber.

5. The method of claim 1 wherein the IC substrate is made from a nonconductive material.

6. The method of claim 5 wherein the nonconductive material is selected from the group consisting of ceramic, polyimide, polyvinyl chloride and Kapton.

7. The method of claim 1 wherein the conductive traces are formed of material selected from the group consisting of silver, copper and copper plated with gold.

8. The method of claim 1 wherein the conductive electroplating material is selected from the group consisting of gold, nickel and silver.

9. A method of electroplating conductive trace lands on an integrated circuit (IC) substrate using an electroplating fixture, said method comprising:
   (a) providing an IC substrate having a plurality of conductive traces formed on a first surface of the substrate, the ends of the traces forming conductive trace lands, selected areas of a resist covering being removed for exposing portions of the traces and trace lands;
   (b) inserting the IC substrate into the electroplating fixture;
   (c) releasably engaging the exposed traces to a conductive elastomer in conductive contact with a metal frame of the electroplating fixture;
   (d) temporarily electrically connecting the metal frame, the conductive elastomer, the plurality of traces and trace lands;
   (e) electroplating the trace lands with conductive material;
   (f) disengaging the conductive elastomer from the IC substrate; and
   (g) removing the IC substrate from the electroplating fixture.

10. The method of claim 9 wherein the conductive electroplating material is selected from the group consisting of gold, nickel and silver.

11. The method of claim 9 wherein the IC substrate is made from a nonconductive material.

12. The method of claim 11 wherein the nonconductive material is selected from the group consisting of ceramic, polyimide, polyvinyl chloride and Kapton.

13. The method of claim 9 further including the step of:
   (h) attaching an integrated circuit (IC) chip to the first surface of the substrate; and
   (i) electrically connecting the IC chip to the electroplated lands.

14. The method of claim 13 wherein the electrical connection between the IC chip and the electroplated trace lands is a wire bond.

15. The method of claim 13 further including the step of:
   (j) electrically attaching a second surface of the IC substrate to a printed circuit board with a plurality of solder ball.

* * * * *